(12) United States Patent
Seng et al.

(10) Patent No.: US 9,041,010 B2
(45) Date of Patent: May 26, 2015

(54) WIDE BAND GAP SEMICONDUCTOR WAFERS GROWN AND PROCESSED IN A MICROGRAVITY ENVIRONMENT AND METHOD OF PRODUCTION

(71) Applicants: William F. Seng, Edgewood, NM (US); Richard L. Glover, Albuquerque, NM (US)

(72) Inventors: William F. Seng, Edgewood, NM (US); Richard L. Glover, Albuquerque, NM (US)

( * ) Notice: Subject to any disclaimer, the term of this patent is extended or adjusted under 35 U.S.C. 154(b) by 113 days.

(21) Appl. No.: 13/904,918

(22) Filed: May 29, 2013

(65) Prior Publication Data
US 2014/0353682 A1    Dec. 4, 2014

(51) Int. Cl.
| | | |
|---|---|---|
| H01L 21/02 | (2006.01) |
| H01L 29/20 | (2006.01) |
| H01L 29/66 | (2006.01) |
| H01L 29/16 | (2006.01) |
| H01L 29/40 | (2006.01) |
| C30B 30/08 | (2006.01) |
| C30B 9/10 | (2006.01) |
| C30B 19/02 | (2006.01) |
| C30B 19/10 | (2006.01) |
| C30B 29/36 | (2006.01) |
| C30B 33/02 | (2006.01) |
| H01L 29/10 | (2006.01) |
| C30B 29/40 | (2006.01) |
| H01L 29/872 | (2006.01) |

(52) U.S. Cl.
CPC .......... *C30B 30/08* (2013.01); *H01L 21/02529* (2013.01); *H01L 29/1608* (2013.01); *H01L 21/02378* (2013.01); *C30B 9/10* (2013.01); *C30B 19/02* (2013.01); *C30B 19/10* (2013.01); *C30B 29/36* (2013.01); *C30B 29/40* (2013.01); *C30B 33/02* (2013.01); *H01L 21/0237* (2013.01); *H01L 21/02546* (2013.01); *H01L 21/02625* (2013.01); *H01L 21/02628* (2013.01); *H01L 29/66053* (2013.01); *H01L 29/872* (2013.01); *H01L 29/1075* (2013.01); *H01L 29/2003* (2013.01)

(58) Field of Classification Search
CPC ...................... H01L 29/2003; H01L 29/66053; H01L 29/1608; H01L 29/40; H01L 21/02378; H01L 21/02529
USPC ...................................... 257/77; 438/105, 931
See application file for complete search history.

(56) References Cited

U.S. PATENT DOCUMENTS

| | | | |
|---|---|---|---|
| 6,734,461 B1 * | 5/2004 | Shiomi et al. ................... | 257/77 |
| 2008/0067524 A1 * | 3/2008 | Basceri et al. ................... | 257/77 |

* cited by examiner

*Primary Examiner* — Phat X Cao
(74) *Attorney, Agent, or Firm* — Alberto A. León

(57) ABSTRACT

Wide band gap semiconductor wafers with previously unattainable characteristics and the method of processing and producing the same are disclosed and claimed herein. Specifically, the application discloses and claims a method to process silicon carbide and other similar wide band gap semiconductors in a microgravity environment. The wafers are placed onto stackable containment systems that create an appropriate gap between each wafer to allow for homogeneous heating and processing. The resulting wide band gap semiconductors have unique molecular structures not attainable when wide band gap semiconductors with the identical chemical composition are produced in a standard 1 gravity environment.

11 Claims, 6 Drawing Sheets

WIDE BAND GAP SEMICONDUCTOR WAFERS GROWN AND PROCESSED IN A MICROGRAVITY ENVIRONMENT AND METHOD OF PRODUCTION

CROSS-REFERENCE TO RELATED APPLICATIONS

Provisional patent application Ser. No. 61/652,414 filed May 29, 2012.

STATEMENT REGARDING FEDERALLY SPONSORED RESEARCH AND DEVELOPMENT

Non-applicable.

THE NAMES OF THE PARTIES TO A JOINT RESEARCH AGREEMENT

Non-applicable.

INCORPORATION-BY-REFERENCE OF MATERIAL SUBMITTED ON A COMPACT DISC

Non-applicable.

BACKGROUND OF THE INVENTION

1. Technical Field of the Invention

The present invention generally relates to the technical field of materials science, more specifically, it relates to the field of compound semiconductors, still more particularly to compound semiconductors with specific physical and chemical properties, and uses resulting from microgravity environment processing and methods of production.

2. Description of the Related Art Including Information Disclosed Under 37 CFR 1.97 and 37 CFR 1.98

The following description of the art related to the present invention refers to a number of publications and other references. Discussion of such references herein is given to provide a more complete background of the principles related to the present invention and is not to be construed as an admission that such references are necessarily prior art for patentability determination purposes.

The invention described and claimed in the present application comprises the innovative combination of at least two technological areas: (1) the creation and management of microgravity environments; and (2) annealing, growth and processing of compound semiconductor materials. Combining those two areas as disclosed and claimed in this application results in the production of a compound semiconductor that has unique molecular structure resulting in physical characteristics not attainable using conventional production methods.

It is well-known and well-understood that gravity affects the structure of a material lattice in two distinct ways: (1) directly through deformation that it imposes on the lattice during formation; and (2) indirectly through convection which induces mixing of the material as a function of the mass of each element. NASA, ESA and other space agencies have sponsored numerous experiments that have shown that production of materials in microgravity suppresses the creation of inclusions, dislocations, and other defects.

In 1998, European researchers conducted a microgravity experiment on a sounding rocket to investigate the structure of SiC layers grown at microgravity conditions and to compare the microgravity results with SiC layers grown using an identical system on the ground. The researchers used Liquid Phase Epitaxy (LPE) to grow the SiC layers and introduced scandium into the silicon melt to increase the solubility of the carbon. A 4H polytype was grown on a 4H seed and a 6H polytype was grown on a 6H seed to determine the differing effect of microgravity on the polytype of SiC. The effect of adding scandium to the melt was to increase the solubility of Carbon in the melt resulting in growth rates increasing from a few μm per hour to as high as 350 μm per hour.

The sounding rocket spent 6 minutes in a microgravity environment (around $5 \times 10^{-6}$ g) and they were able to grow 20 μm of SiC during that time. Control samples grown on-ground have a similar surface appearance to the microgravity grown samples but contain scandium carbide precipitates, nanopipes, micropipes and/or cavities as verified by TEM. However, none of the those defects were found in the sample grown in microgravity. So, they concluded that samples grown "in space microgravity conditions are superior in their defect structure to those ones grown on the ground."

As previously, microgravity provides an environment that allows atoms in the material to arrange into their preferred, lowest energy state, free of irregularities and defects. The problem with the 1998 experiment described herein above was that the material had been doped with scandium to increase the solubility of the carbon. While this is a common process used on Earth to speed the growth of SiC layers it did add a new material to the structure of the resulting lattice. Scandium doesn't affect the electrical properties of the resulting SiC layers but the impact to the physical structure is not known, especially during formation in microgravity.

Additional research and experimentation is necessary to determine if silicon carbide grown in a microgravity environment without added Scandium would also be defect free. Further, since gravity is a physical effect on the lattice structure and formation, each dopant added to the silicon carbide melt has to be analyzed for its effect on the resulting structure during growth in microgravity. Therefore, the fact that researchers were able to grow defect-free silicon carbide with added scandium does not demonstrate that all silicon carbide produced in microgravity would be defect free.

The initial research conducted as a result of the 1998 experiment was useful, but it was far from teaching or suggesting methods to enable a person of ordinary skill in the art to develop our claimed invention without additional detailed research and experimentation.

A. Glossary of Technical Terms

In order to facilitate the examination process, Applicants thought it useful to provide a glossary of technical terms used in the present application.

Annealing—A process used in semiconductor device fabrication which consists of heating multiple semiconductor wafers in order to affect their electrical properties. Heat treatments are designed for different effects. Wafers can be heated in order to activate dopants, change film to film or film to wafer substrate interfaces, densify deposited films, change states of grown films, repair damage from implants, move dopants or drive dopants from one film into another or from a film into the wafer substrate.

Atomic Layer Deposition (ALD)—ALD is a self-limiting (the amount of film material deposited in each reaction cycle is constant), sequential surface chemistry that deposits conformal thin-films of materials onto substrates of varying compositions. Due to the characteristics of self-limiting and surface reactions, ALD film growth makes atomic scale deposition control possible.

Basal Plane Dislocation (BPD)—A crystallographic defect, or irregularity, within the crystal structure of the basal plane, the plane perpendicular to the principal axis in these crystal systems.

Buoyancy—The upward force exerted by a fluid, which opposes the weight of an immersed object.

Carrot Tail Defect—Roughly carrot shaped features in the surface of a silicon carbide film. The features are aligned along the step flow direction of the film and are characteristically longer than the depth of the layer in which they are formed.

Comet Tail Defect—A roughly spherical feature with an elongated tail (like a comet) in the surface of a silicon carbide film.

Compound Semiconductors—A semiconductor compound comprising elements from two or more different groups of the periodic table.

Convection—The concerted, collective movement of ensembles of molecules within fluids. Convection of mass cannot take place in solids, since neither bulk current flows nor significant diffusion can take place in solids.

Defect—Any deviation from the pure lattice population for a given material. Usually occurs when one or more atoms are not allowed to populate their preferred chemical location on a material's lattice. For example, a defect can be when one or more locations on a material's lattice are empty because the appropriate atom could not make it to that location or it can occur when the wrong atom populates a location on the lattice.

Dopants—A trace impurity element that is inserted into a substance (in very low concentrations) in order to alter the electrical properties or the optical properties of the substance. In the case of crystalline substances, the atoms of the dopant very commonly take the place of elements that were in the crystal lattice of the material.

Epitaxial Layer (Epi layer)—A semiconductor layer whose crystallographic structure reproduces structure of the substrate but doping level and conductivity type of epitaxial layer is controlled independently of the substrate.

Hydride Vapor Phase Epitaxy (HVPE)—An epitaxial growth technique often employed to produce semiconductors such as GaN, GaAs, InP and their related compounds. Carrier gasses commonly used include ammonia, hydrogen and various chlorides.

Hydrostatic Pressure—The pressure exerted by a fluid at equilibrium due to the force of gravity.

Ion Implantation—The generation of an ion beam and steering it into the substrate so that the ions come to rest beneath the surface. Ions may be allowed to travel through a beam line at the energy at which they were extracted from a source material, or they can be accelerated or decelerated by dc or radio-frequency (RF) electric fields.

Large Scale Integration (LSI)—The process of integrating several thousand circuits on a single chip.

Liquidus Line—The minimum temperature at which all components of a mixture can be in a liquid state. Below the liquidus line the mixture will be partly or entirely solid.

Liquid Phase Epitaxy (LPE)—A crystal growth technique involving the near equilibrium growth of a compound from a saturated solution that is placed in contact with a polished substrate. Just before or just after the surface of the substrate has been coated, the temperature is lowered from the equilibrium temperature at a controlled rate bringing on super saturation of the solution and leading to precipitation and epitaxial growth of the dissolved material onto the substrate.

Medium Scale Integration (MSI)—The process of integrating hundreds of circuits on a single chip.

Metal-organic Molecular Beam Epitaxy (MOMBE) or Metal-organic Vapor Phase Epitaxy (MOVPE)—A chemical vapor deposition method used to produce single or polycrystalline thin films. It is a highly complex process for growing crystalline layers to create complex semiconductor multi-layer structures.

Micropipes—empty-core screw dislocations with large strain energy (i.e. they have large Burgers vector); they follow the growth direction (c-axis) in silicon carbide boules and substrates propagating into the deposited epitaxial layers.

Molecular Beam Epitaxy (MBE)—A method of laying down layers of materials with atomic thicknesses on to substrates. This is done by creating a 'molecular beam' of a material which impinges on to the substrate.

Motility—Spontaneous movement.

Polytype (4H, 6H, etc)—These are families of similar crystalline structures of the same chemical compound that are identical in two dimensions and differ in the third. The different polytypes have widely ranging physical properties.

Preferred Lowest Energy State—The overall energy state of a material when each atom is allowed to settle into its preferred chemical location on the material lattice in the absence of external forces. Some materials can settle into this lowest energy state even in the presence of gravity or other external forces. Other materials (wide band gap semiconductors for example) tend to be perturbed by external forces such as gravity and the atoms end up in locations that put the overall material in a higher energy state. The result is that the lattice is not properly populated and the material ends up with what are defined as defects (see definition above).

Sedimentation—The tendency for particles in suspension to settle out of the fluid in which they are entrained, and come to rest against a barrier. This is due to their motion through the fluid in response to the forces acting on them: these forces can be due to gravity, centrifugal acceleration or electromagnetism.

Small Scale Integration (SSI)—The process of integrating tens of circuits on a single chip.

Substrate—A solid (usually planar) substance onto which a layer of another substance is applied, and to which that second substance adheres. In the manufacture of integrated circuits (ICs), the substrate material is usually formed into or cut out as thin discs called wafers, into which the individual electronic devices (transistors, etc.) are etched, deposited, or otherwise fabricated.

System-on-a-Chip (SOC)—Is an integrated circuit that integrates all components of a computer or other electronic system into a single chip. It may contain digital, analog, mixed-signal, and often radio-frequency functions—all on a single chip substrate. A typical application is in the area of embedded systems.

Threaded Screw Dislocations—A common dislocation that transforms successive atomic planes within a crystal lattice into the shape of a helix.

Very Large Scale Integration (VLSI)—The process of integrating hundreds of thousands of circuits on a single chip.

Wafer—A wafer can be a substrate alone or it can be a substrate with one or more epitaxial layers.

Wafer Defect Density—Is a representation of the average number of total defects distributed across the entire wafer. It is normally represented as X/area. This is sometimes listed as a density for specific defects, for example Micropipe Defect Density is the average number of micropipes per unit area.

Wafer Scale Integration (WSI)—A yet-unused system of building very-large integrated circuit networks that use an entire wafer to produce a single "super-chip". Through a combination of large size and reduced packaging, WSI could lead to dramatically reduced costs for some systems, notably massively parallel supercomputers.

Wide Band Gap Semiconductors—Semiconductor materials with electronic band gaps significantly larger than one electron volt (eV). The exact threshold of "wideness" often depends on the context, but for common usage, "wide" bandgap typically refers to material with a band gap significantly greater than that of the commonly-used semiconductors, Silicon (1.1 eV) or gallium arsenide (1.4 eV).

B. What are Microgravity Environments?

Gravity is widely used to describe the attractive force between two objects with mass. Gravity is one of nature's fundamental physical forces and it affects all physical, chemical and biological processes on Earth. On the surface of the Earth, gravity applies an attractive force that attempts to accelerate an object towards the center of the Earth at approximately 9.8 meters/seconds$^2$ (m/s$^2$). Scientists believe that gravity is present throughout the universe, and that the strength of the gravitational force is directly proportional to the mass of an object and the distance from the object. For example, to reach a point where Earth's gravitational pull is reduced to one-millionth of that at the earth's surface, you would need to be approximately 6.37 million kilometers from the earth (that's over 16 times farther than the moon).

Since gravity pervades all aspects of the processes that take place on earth, humans have grown accustomed to its impact. Until relatively recently, we have assumed that the only way for all processes to occur was with the known influence of gravity. The advent of space travel changed that paradigm. Space travel gave rise to experimentation in environments with significantly less gravity than perceived on earth. That experimentation lead to the discovery that many processes and compositions of matter behave differently in so-called "microgravity environments."

The term microgravity (μg) is generally defined as an environment where the local gravitational force is less than the standard gravity experienced on the surface of the earth (1 g). The exact force experienced in microgravity environments is a function of what method is used to create them. For example, a parabolic flight in an aircraft will result in a gravitational force that is about 1% of standard 1 g while a free flying satellite will experience about one millionth the force of standard 1 g. A potential impediment for understanding and furthering microgravity experimentation is that the ability to create and sustain a true reduced experimental gravity environment is much more complicated than merely reducing the effect of gravity.

As scientists have started to gain a better understanding of the impact of microgravity environments on processes, they have discovered that gravity's effect impedes a thorough understanding of many physical, chemical and biological phenomena. It is now widely known that gravity can mask some of the underlying, but critical, parameters that influence physical, chemical or biological processes. Gravity causes sedimentation, buoyancy and convection in liquids, creates hydrostatic pressure in liquids and modifies the behavior of liquid films on a surface. On the other hand, gravity tends to overwhelm capillary effects, multiphase flow, and diffusive transport processes.

As a result of the discoveries to date, it is generally understood that gravity is a factor in every process on Earth. In most processes, its impact is negligible. However in some processes gravity is one of the key factors that leaves an imprint on the final structure of materials. Therefore the creation of reduced gravity environments for experiments has become a very important research area. While it is nearly impossible to create a gravity free environment, creating, monitoring and manipulating processes in a so-called microgravity environment has been achieved.

Microgravity experiments have revealed that even small forces present during a process can affect the process itself, i.e., the way the process takes place and the results. Further, it is common to conduct experiments free of vibrational and other imparted forces. Our present technological state does not allow full isolation from gravitational forces. It is well known that small forces acting on a process, whether vibrational or directional, can have similar effects on the process as gravity. For example, measurements on the International Space Station (ISS) showed large fluctuating accelerations, averaging approximately one thousandth of earth's gravity, which arose from movements of the crew, operation of equipment, spacecraft attitude adjustment, and waste dumps' operation. It was shown both theoretically and experimentally that those accelerations as well as other high-frequency vibrations can significantly impact the results of on-board experiments.

The similarity among the effects that different forces exert on processes, have brought about a pervasive misuse of terms. In many instances, when reporting experimental results in a "microgravity environment," what is actually being reported are results obtained in environments free of outside forces and accelerations. That misuse of terminology brings about an important distinction. Unique organic and inorganic materials result from production in an environment free of external forces and not merely because they were created in microgravity. Staying consistent with the generally accepted terminology, when the terms "microgravity" is used in this application, it refers to environments in which gravity is reduced and all of the other forces mentioned above have been reduced or eliminated as well.

C. How can Microgravity Environments be Achieved?

There are a number of ways to achieve microgravity environments as defined above. Each manner of creation is distinct from the other in terms of duration and quality of the microgravity environment as well as the effort, including cost, required to achieve each one. These different methods are briefly discussed below.

1. Drop Towers.

A drop tower comprises a vertical shaft capable of providing a short-lived microgravity environment during the free fall of an experimental package for a time period proportional to the height of the tower. Microgravity levels between 10-3 g and 10-5 g have been measured in drop towers by adopting different techniques to counter the effect of acceleration due to gravity. Most experiments conducted using drop towers result in 2-3 seconds of microgravity. The Microgravity Center in Kami-Sunagwa, Hokkaido, Japan, however, is built in an old mine shaft and offers up to 10 seconds at 10-5 g. In addition to the short duration of microgravity, a major disadvantage of drop towers is the effect of impact the package undergoes at the bottom of the tower.

2. Parabolic Flights.

Aircraft can fly in a series of parabolic arcs to achieve longer periods of microgravity, typically 20 to 25 seconds. The resulting microgravity environment during these parabolic arcs is 10-2 g to 10-3 g. In order to achieve microgravity, the airplane must climb rapidly until its nose is at about a 45-degree angle to the horizon then the engines are cut back. The airplane slows and the plane remains in free fall over the top of the parabola, to then nose-dive to complete the parabola. One of the major disadvantages of microgravity environment created using aircraft is the short duration.

3. Balloon Drop.

Stratospheric balloons can reach altitudes of 39 to 41 km and are being used regularly for a variety of missions, including space science missions. Those high altitude missions have also been used for microgravity research. Effectively, stratospheric balloons can be the equivalent of a very high drop tower. Stratospheric balloons can achieve a microgravity environment of 10-2 g to 10-3 g for up to 50 seconds. Stratospheric balloons present two significant drawbacks when use to create microgravity environments: (a) like the drop tower, the package must come to rest at the bottom of the drop, either by parachute or impact; and (2) the overall microgravity environment is very poor due to random and irregular atmospheric buffeting and vibration.

4. Suborbital Rockets.

Suborbital rockets also fly parabolic paths but fly much higher than an airplane (up to 1500 Km depending on the rocket). This can result in up to 20 minutes of very high quality microgravity, 10-3 g to 10-4 g. The primary disadvantage of using suborbital rockets to conduct experiments in microgravity environments is the packaging requirements for the experiments. Such a package must fit within the volume constraints of the rocket and survive the high g launch load (up to 16 g) as well as the landing (up to 10 g shock).

5. Free Flying, Recoverable Satellites.

Free flying satellites (as contrasted with the International Space Station or the now retired Space Shuttles) provide an excellent microgravity environment for producing and processing materials. A free flying satellite in a 500 Km orbit can provide an environment of 10-5 g to 10-6 g for many months. The main drawbacks of using free flying satellites to conduct experiments or processes in microgravity environments, are the requirements of safe reentry into the earth's atmosphere and safe landing for recovery of the experimental package. That process is well understood and practiced routinely, however, it is more complex than a sounding rocket recovery system for example.

C. Summary of Available Microgravity Environments

| Method of Creation | Duration | Microgravity |
| --- | --- | --- |
| Drop tower | 2-10 seconds | 10-2 g to 10-5 g |
| Parabolic aircraft | 25 seconds | 10-2 g to 10-3 g |
| Balloon drop | 30-50 seconds | 10-2 g to 10-3 g |
| Suborbital rocket | 4-20 minutes | 10-3 g to 10-4 g |
| Free flying satellite | months | 10-5 g to 10-6 g |

D. Growth and Processing of Compound Semiconductors

There are a wide variety of methods used to grow and process compound semiconductors. Some of the most popular methods used for growing both substrates and epitaxial layers include metalorganic vapour phase epitaxy (MOVPE), molecular beam epitaxy (MBE), hydride vapour phase epitaxy (HYPE), liquid phase epitaxy (LPE), metal-organic molecular beam epitaxy (MOMBE) and atomic layer deposition (ALD). After the substrates or epitaxial layers have been grown, manufacturers sometimes use thermal annealing to further affect the electrical properties of the material. The most common uses for thermal annealing is to activate dopants, change film-to-film or film-to-wafer substrate interfaces, densify deposited films, change states of grown films, repair damage from ion implantation, move dopants or drive dopants from one film into another or from a film into the wafer substrate.

Note that all these methods utilize mass transfer via gaseous or liquid flow of material. This flow is changed by non-linear interactions of gravity with the flowing mass impacting the walls of the chamber, initially intended to simply direct the laminar flow but ultimately resulting in convective turbulent mass flow and non-stoichiometric interactions causing defects and atomic arrangement faults. Annealing materials such as compound semiconductors in a microgravity or force-free environment allows the material to relax into its preferred atomic structure. Importantly, annealing of materials in microgravity can be used on both thin epitaxial layers of material, much thicker substrates of material, or the combination of both. This is important for ultimate applications to both vertical and horizontal transport-based electronic devices.

BRIEF SUMMARY OF THE INVENTION

The present application discloses and claims a family of wide band gap semiconductor wafers grown and processed in a microgravity environment (free of external forces). The growth and processing of compound semiconductors in a microgravity environment allows atoms in the material to arrange into their preferred, lowest energy state, free of irregularities and defects. These irregularities and defects include, but are not limited to, carrot & comet tails, threaded screw dislocations, basal plane dislocations, and micropipes. Those common defects result from external forces (primarily gravity) acting on the material as it grows and solidifies, which prevent the material from settling to its preferred, lowest energy state. The compound semiconductors resulting from growth and production in a microgravity environment represent a new composition of matter with material characteristics unique to this production method.

BRIEF DESCRIPTION OF THE SEVERAL VIEWS OF THE DRAWINGS

The accompanying drawings, which are incorporated into and form a part of the specification, illustrate an embodiment of the present invention and, together with the description, serve to explain the principles of the invention. The drawings are only for the purpose of illustrating various embodiments of the invention and are not to be construed as limiting the invention.

DETAILED DESCRIPTION OF THE INVENTION

Objects, advantages and novel features, and further scope of applicability of the present invention are set forth in the detailed description below, taken in conjunction with the accompanying drawings. The objects, advantages and novel features, and further scope of applicability of the present invention will become apparent to those skilled in the art upon examination of the following, or may be learned by practice of the invention. The objects and advantages of the invention may be realized and attained by means of the instrumentalities and combinations particularly pointed out in the appended claims.

The present application discloses and claims novel silicon carbide and other wide band gap semiconductors, which are new to the extent that their characteristics, properties, specifications and functionality are different from the same semiconductors produced by different methods. The present application also discloses and claims a method to produce silicon carbide and other similar wide band gap semiconductors in a microgravity environment (free of external forces). The method of the present invention results in new wide band gap semiconductors to the extent that they have significantly reduced defects when compared to wide band gap semiconductors produced in a standard 1-gravity environment.

The impact of processing wide band gap semiconductors in microgravity is illustrated by comparing the defect densities of a high quality SiC wafer produced in a 1-gravity environment with the defect density of a SiC wafer produced in a microgravity environment and having a modified internal structure. We call the microgravity produced silicon carbide wafer MEM-S1 (Microgravity Enabled Material-Semiconductor #1). The table below illustrates the differences with a side-by-side comparison, and shows the extremely low defect density of MEM-S1.

| Defect Density | | |
| --- | --- | --- |
| | High Quality SiC | MEM-S1 |
| Micropipe Defect Density | <1 cm$^{-2}$ | 0 |
| Micropipe Free Area | >98% | 99.9% |
| Basal Plane Dislocation Density | 300-400 cm$^{-2}$ | <10 cm$^{-2}$ |
| Dislocation Free Area | 50% | >90% |

There are two processes which work together to prevent or reduce defects in silicon carbide wafers when produced in microgravity. First is the lack of convection which prevents sedimentation, buoyancy and hydrostatic pressure while the melt is in a liquid phase. The result is a lower energy melt which can settle into its preferred and lowest energy state as a crystal. This lack of convection is particularly important when using Liquid Phase Epitaxy (LPE), as the researchers in 1998 did, to grow the epitaxial layers.

Figure 1:
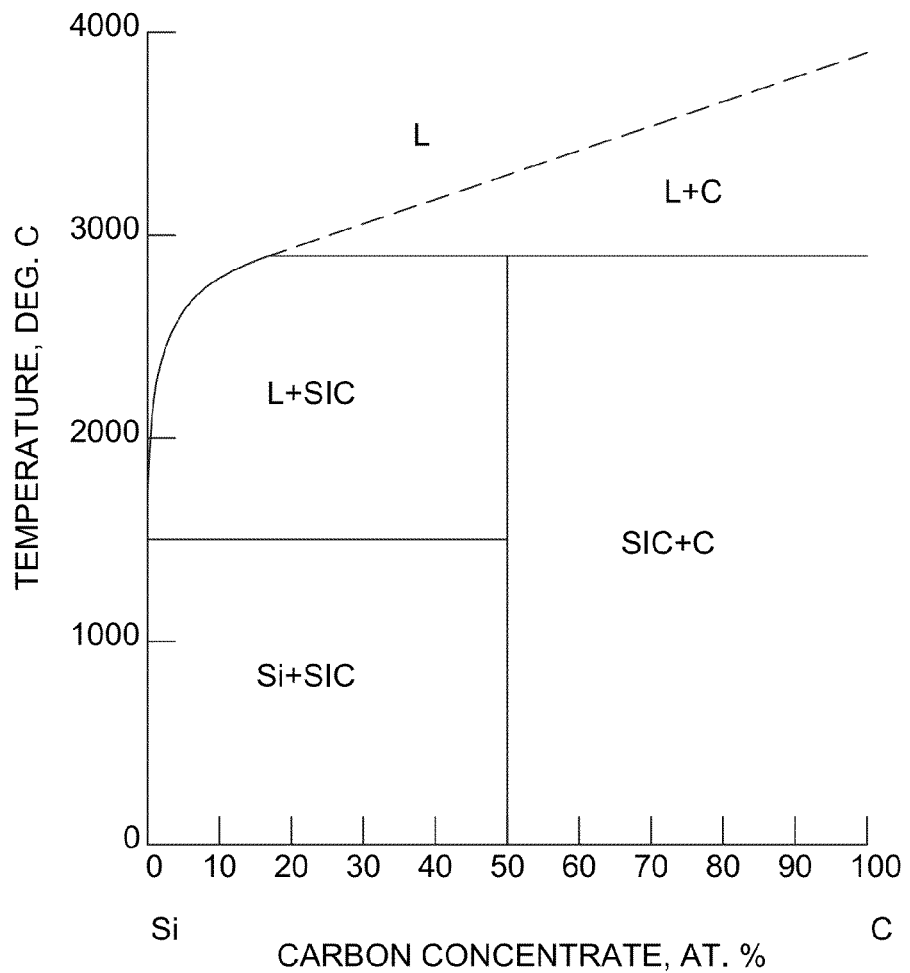
FIG. 1: is a graphic of carbon concentration over temperature during the LPE growth process for SiC.

The LPE process grows an epitaxial film by first creating a melt of the compound to be grown in a solvent. For example, in growing GaAs, the melt is typically comprised of the solute GaAs and a solvent of Ga. For growing SiC, as in this case, the melt is typically Si, C, and Sc, with Sc as the solvent and SiC as the solute. Viewing this process from a phase diagram perspective, FIG. 1, the melt temperature is by definition above the liquidus line. Then the melt is temperature controlled precisely to bring the temperature beneath the liquidus line. The temperature controls the atomic fraction of Si to C precipitating out the supersaturated melt, leaving the rest of the solute material still in the melt, because at a given temperature there is a specific mass of Si and C which is extracted from the melt via precipitation-driven equilibrium at any given temperature as defined by the phase diagram.

There are two basic variations of LPE techniques: the first known as the equilibrium cooling process, the second as the step-cooling process. In both processes the melt is created at a temperature T and then is lowered, causing the melt to become supersaturated and temperature driven to equilibrium by precipitating out the excess solute SiC. Over time the growth rate will decrease as SiC is depleted from the melt through precipitation. Besides temperature, time is the other important control variable of the process. Thickness of the grown layer increases of $T^{1/2}$, while growth rate itself decreases with $T^{1/2}$.

The second process occurs when an existing SiC wafer with defects is placed in a microgravity environment and heated to a point where the atoms in the lattice begin to experience motility. In the absence of gravity and other perturbing forces, the material will settle into its lowest energy state and the defects which were caused by external forces will be eliminated. Once the material is cooled to a point where the atoms no longer have motility, the crystal will be in its natural, lowest energy state. We call this process "healing the wafer" and it is similar to what is known as "annealing" in the metal working industry.

In comparison to traditional semiconductor film growth techniques, the advantages of our innovative process in producing defect-free SiC through a healing process in microgravity include:
  1. No required gaseous or liquid constituents, making mass flow control simpler.
  2. No incorporation of melt constituents (via LPE) or gas (via MBE or ALD)
  3. Ability to heal entire structures, not just thin layers, because of SiC's high thermal conductivity and diffusivity (substrates only, substrates with a thick epi layer or a complete multi-layer wafer designed for large scale device fabrication)

The healing process occurs independently of the type of process used for the original wafer growth. This allows manufacturers to produce the initial wafer substrate, and epi layers if desired, using the most cost efficient process available without being overly concerned about defects. The healing process will eliminate the defects resulting from whatever process is used.

This composition of silicon carbide, which we call MEM-S1 cannot be produced in the standard 1-gravity environment of Earth. During growth, convection results in additional energy entering the melt and preventing the material from settling into its lowest energy state. This convection and interaction with the walls of the growth chamber results in non-stoichiometric chemical mixing of mass resulting in multiple polytypes or in structural defects such as stacking faults, screw dislocations, or other non-epitaxial atomic structural arrangements. These essentially cause the formation of a structural state, which is not truly SiC but a random mix of SiC chemistry with a less ideal structure, resulting in degradation of electronic device performance. Importantly, the healing process by annealing in gravitational environments also does not work because the force of gravity (though small)

still imparts sufficient energy on a per atom basis into the material to prevent the atoms from settling to their natural, lowest, and defect-free state.

The impact of this defect-free material is critical to semiconductor device manufacturers. Manufacturers talk of the yield of a process, a percentage of input material to saleable output devices. Yield is further delineated by binning, meaning that any successful devices produced are separated into groups ranging from excellent to just satisfactory. The smaller the device, the less the capture cross section (percentage change of encompassing) of material defects. This is exactly why initial products in new material systems such as widebandgaps are always small devices like Schottky diodes, because the material is so poor and defect-ridden that to have any chance of an economically viable process the chance of inclusion of defects must be small to increase yield. And there is no thought at all at this stage of producing large-scale devices such as microprocessors or FPGAs because the base semiconductor material is too poor and defect-ridden. In truth, it is not really an epitaxial semiconductor but a combination of materials and structure having short-range order but not long-range structural order and chemistry. The process we describe produces semiconductor composition of matter material capable of being used to manufacture both small and large scale devices. This is critical not just for manufacturing but also for U.S. lead in semiconductors in general.

The method of production disclosed and claimed herein creates Silicon Carbide, or any other wide band gap semiconductor that is defect free. Examples of other wide band gap semiconductors that can be processed using this method include Galium Arsenide (GaAs), Indium Phosphide (InP), Cadmium Telluride (CdTe) and Galium Nitride (GaN). The wafer's substrate, whether SiC or another semiconductor, can also have one or more epi layers. This method involves healing existing wafers using a modified furnace to heat the material in a microgravity environment and then using a gas flow process to cool the material while it is still in microgravity.

Figure 2:
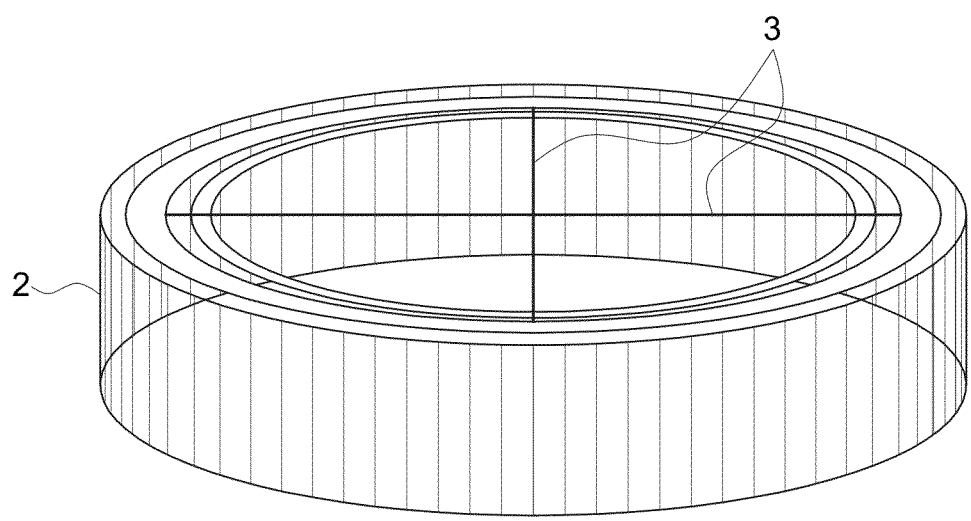
FIG. 2: is a perspective view of a wafer containment stackable module. The module is constructed with an appropriate high temperature wire material. One example of a material for the processing of SiC is Rhenium wire.
Figure 3:
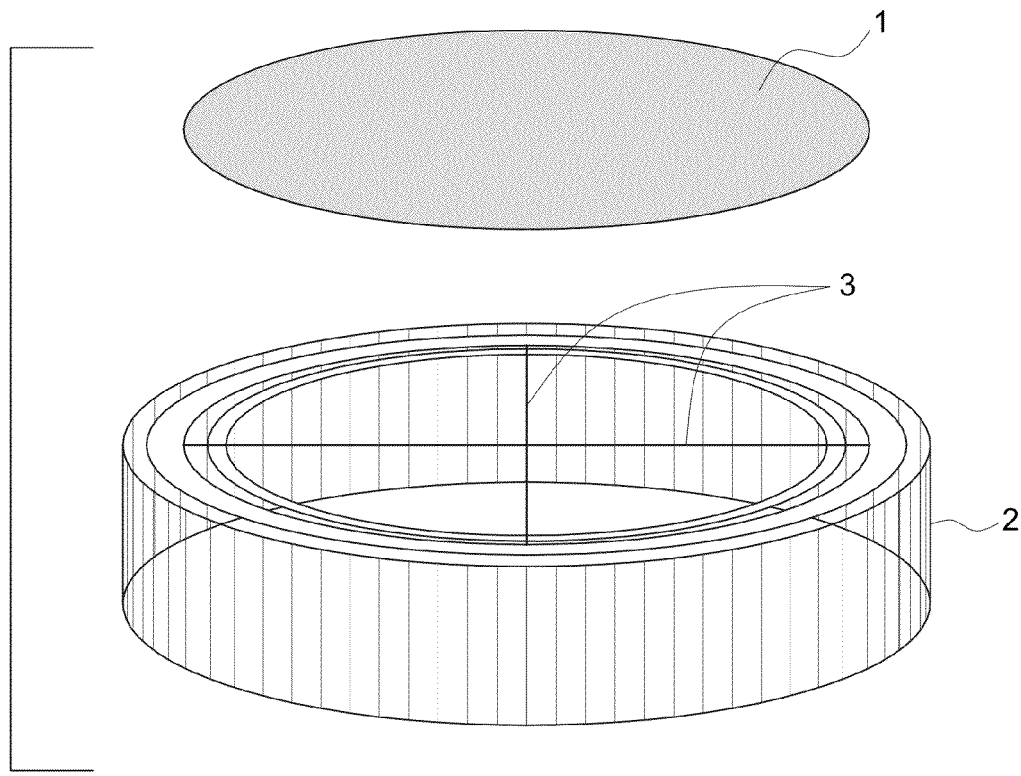
FIG. 3: illustrates the placement of a wide band gap semiconductor wafer on top of the wafer containment system/ stackable module.
Figure 3:
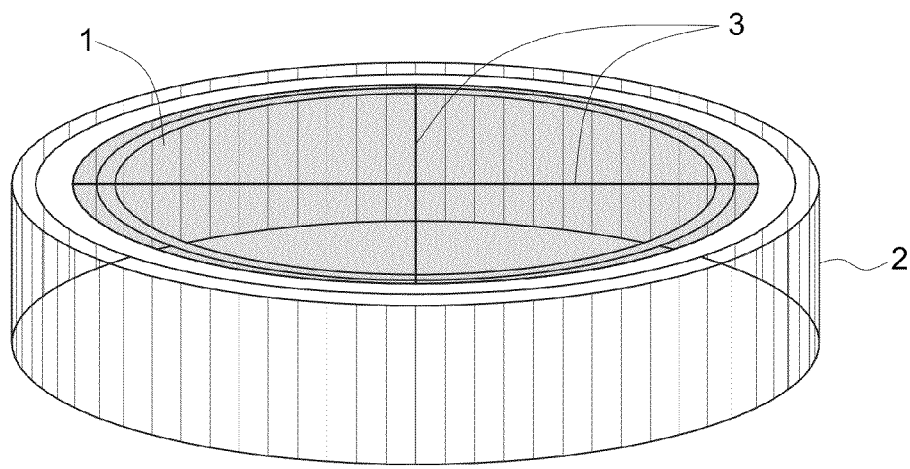
Figure 4:
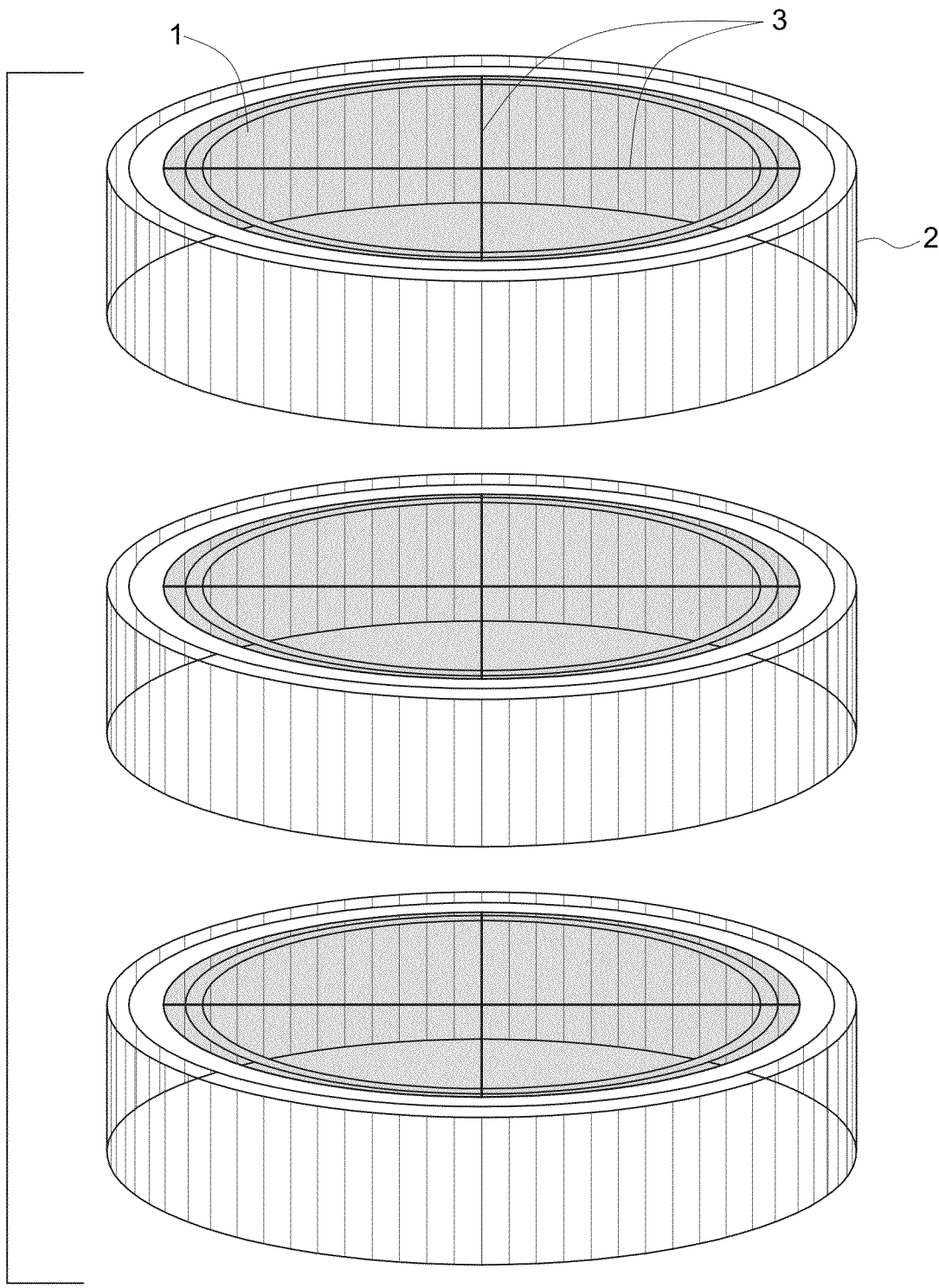
FIG. 4: illustrates how the wafer containment systems, with wide band gap wafers in place, stack on top of each other.
Figure 5:
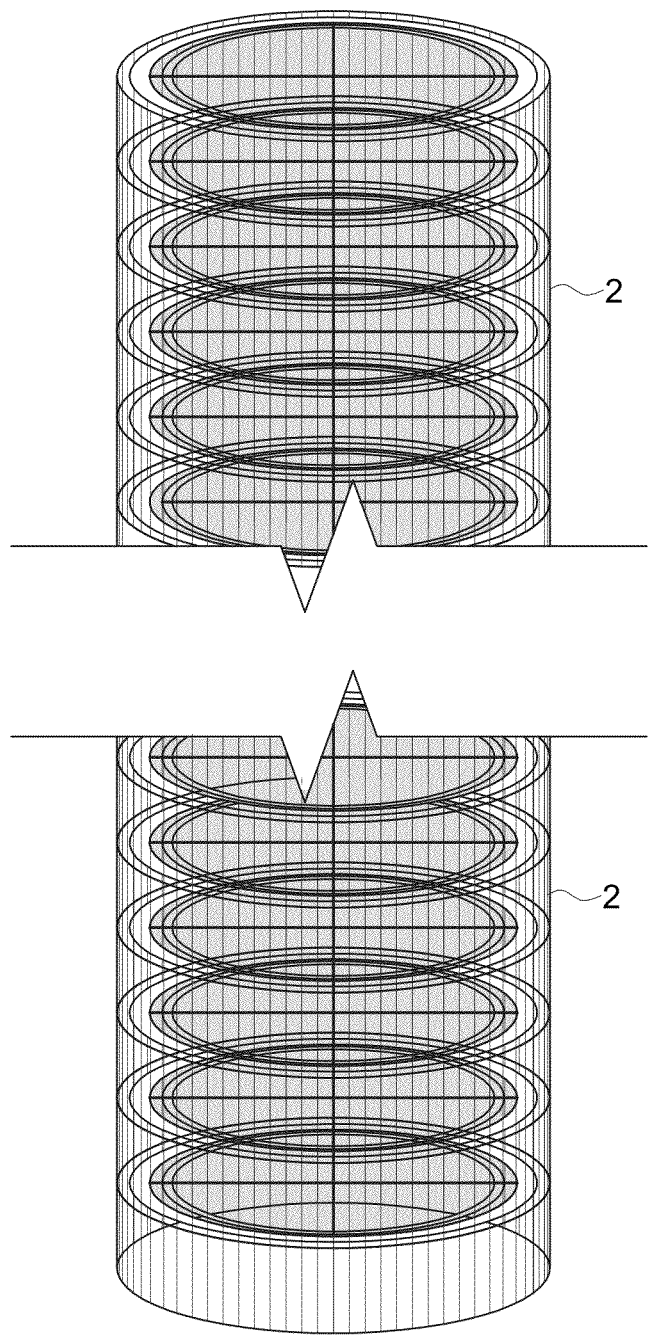
FIG. 5: illustrates one embodiment of the stackable structure that supports 25 wafers.

The healing process uses a special high temperature furnace capable of achieving a heat zone up to 2400 C. The healing process begins by placing the silicon carbide wafers in a specially designed containment system (2). The containment system, as depicted in FIGS. 2-5, is composed of stackable modules. The module is constructed with an appropriate high temperature wire material. One example of a material for the processing of SiC is Rhenium wire. FIG. 2 illustrates how thin wire can be used to support the wafers (1) in the heat zone of the furnace. This structure and similar designs provide support for the wafer while it is being transferred to the microgravity zone and returned to normal 1 g. During the transfer, the wafers and containment zone may be subjected to gravity levels much greater than 1 g so it must provide sufficient structural support while also allowing for the heat from the furnace to heat the entire wafer. Simply stacking the wafers on top of each other would not allow each wafer to be completely and homogeneously heated. The result would be that parts of some of the wafers would not reach a temperature high enough to enable atomic motility and therefore would not be able to settle into its preferred lowest energy state while in microgravity. In the case of inhomogeneous heating, the resulting wafer would not be defect free. Hence, the containment design is very important. The top (4) of the containment system (2) has crossing wires (3) to provide additional support for the wafer. The bottom (5) of the containment system does not have the crossing wires. FIG. 3 illustrates the placement of the wafer (1) on to the containment system (2). The wafer (1) is placed with either of its flat sides on to the top of the containment system as illustrated. FIG. 4 shows how containment systems with a wafer on top can be stacked on to other containment systems with wafers on top of each additional containment system. The bottom (5) of one container system with a wafer on the top is placed directly on to the top (4) of another containment system with a wafer placed on its top. The height of each containment system as defined by the distance between the top and the bottom can be varied as necessary to accommodate different furnace sizes. FIG. 5 illustrates one embodiment of 25 containment systems stacked on top of each other in the manner illustrated by FIG. 4. Other embodiments can hold more or less wafers. Rhenium wire was chosen as our preferred embodiment for the containment system because it can withstand the high temperatures and does not react with silicon carbide to form compounds. However, other materials might be preferred for other materials and furnace temperatures. The containment system is designed to maximize the number of wafers that can fit within the heat zone of the furnace while still providing a gap between each wafer to ensure even heating of all the wafers.

The atmosphere of the furnace heat zone can be a vacuum, air, or an inert gas such as Argon. The wafers are heated to a specific temperature to achieve atom motility within the crystal structure. The furnace is placed into one of the microgravity environments described earlier and the material is allowed to settle into its lowest energy state. The wafer is then cooled to a temperature that stops significant atom motility and the furnace is removed from the microgravity environment. This process is repeated as many times as necessary to achieve the desired wafer defect density.

Figure 6:
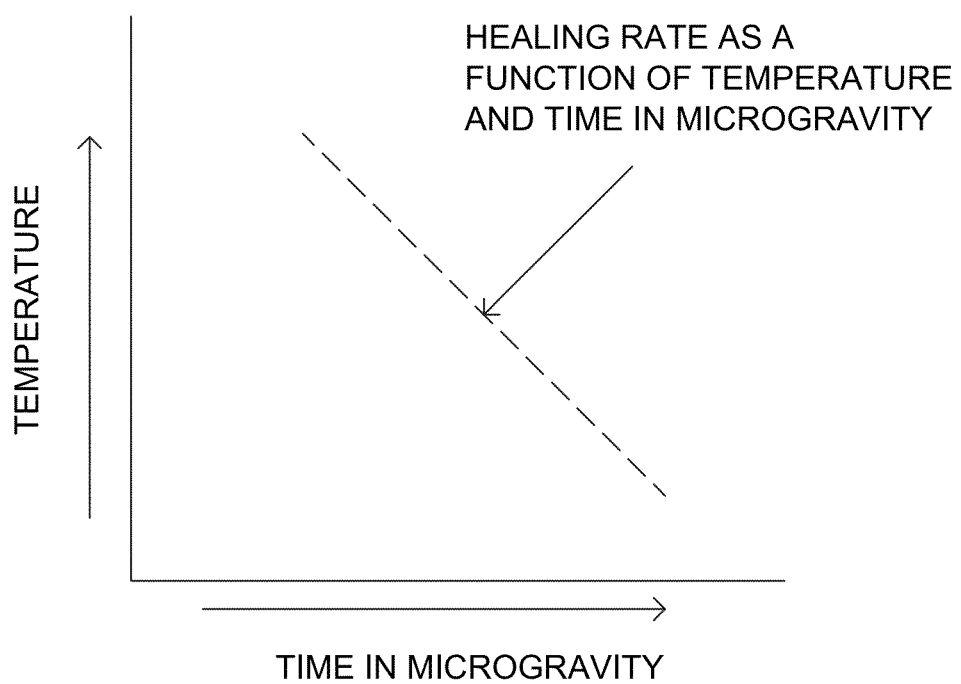
FIG. 6: illustrates the general healing rate of wide band gap semiconductor material as a function of temperature and time in microgravity.

The speed of the healing process scales with time and temperature. At higher temperatures, the healing process speeds up and requires less time in microgravity. Lower temperatures, but still high enough to induce motility, require longer times in microgravity to achieve the same level of healing. FIG. 6 illustrates a linear interpretation of this relationship. In fact the exact relationship of the healing process can vary significantly depending on the material being processed and in most cases the relationship will be nonlinear. Specifically, the healing rate defines how quickly the atoms within the structure move from a location on the lattice that represents a defect, hence higher energy state, to a point on the lattice that is lower energy and represents the preferred state of the material. Once the atom or multiple atoms within a local region move to the lower energy state then that specific defect is defined as being healed. Since most of the wide band gap material we are processing has multiple defects and many different types of defects, the healing rate is an empirical relationship that measures the transition of the wafer from multiple defects of all kinds to zero defects of any kind. It is an extremely useful term for planning purposes.

In some embodiments, the substrate is processed through to a high voltage switch. This enables the resulting wafer to be used in high voltage transmission lines and electrical motors.

As with other integrated circuits, individual electronic devices (transistors, etc.) can be etched, deposited, or otherwise fabricated on the wafers. In one embodiment of the invention, more than 500 transistors can be fabricated on the wafers in a multi-element arrangement. The circuit elements are inseparably engaged and electrically interconnected so that the resulting wafer is indivisible for the purposes of manufacture and incorporation into multiple commercially marketable products.

What is claimed is:

1. A wide band gap semiconductor wafer comprising a silicon carbide (SiC) substrate, the silicon carbide substrate comprising atoms arranged into their preferred, lowest energy state and with an extremely low defect density, the SiC substrate comprising the following ranges of material characteristics:
a. a micropipe density of less than 0.01 $cm^{-2}$;
b. a micropipe free area greater than 99%;
c. a basal plane dislocation density of less than 0.01 $cm^{-2}$;
d. a basal plane dislocation free area greater than 99%; and
e. cumulative areal defects of less than 1% of wafer area.

2. The wide band gap semiconductor wafer of claim 1 wherein the substrate is selected from the group consisting of Galium Arsenide (GaAs), Indium Phosphide (InP), Cadmium Telluride (CdTe) and Galium Nitride (GaN).

3. The wide band gap semiconductor wafer of claim 1 further comprising a multi-element, integrated circuit, the circuit comprising more than 500 transistors with the circuit elements being inseparably engaged and electrically interconnected so that the resulting wafer is indivisible for the purposes of manufacture and incorporation into multiple commercially marketable products.

4. A wide band gap semiconductor wafer comprising a silicon carbide (SiC) substrate and one or more epi layers, the silicon carbide substrate and the one or more epi layers comprising atoms arranged into their preferred, lowest energy state and with an extremely low defect density, the SiC substrate and the one or more epi layers comprising the following ranges of material characteristics:
a. a micropipe density of less than 0.01 $cm^{-2}$;
b. a micropipe free area greater than 99%;
c. a basal plane dislocation density of less than 0.01 $cm^{-2}$;
d. a basal plane dislocation free area greater than 99%; and
e. cumulative areal defects of less than 1% of wafer area.

5. The wide band gap semiconductor wafer of claim 4 wherein the substrate is selected from the group consisting of Galium Arsenide (GaAs), Indium Phosphide (InP), Cadmium Telluride (CdTe) and Galium Nitride (GaN).

6. The wide band gap semiconductor wafer of claim 4 wherein the one or more epi layers are selected from the group consisting of Galium Arsenide (GaAs), Indium Phosphide (InP), Cadmium Telluride (CdTe) and Galium Nitride (GaN).

7. The wide band gap semiconductor wafer of claim 4 wherein either the substrate or the one or more epi layers can be selected from the group consisting of Galium Arsenide (GaAs), Indium Phosphide (InP), Cadmium Telluride (CdTe) and Galium Nitride (GaN) so that all possible substrate and epi layers permutations can be achieved.

8. The wide band gap semiconductor wafer of claim 4 further comprising a multi element, integrated circuit, the circuit comprising more than 500 transistors with the circuit elements being inseparably engaged and electrically interconnected so that the resulting wafer is indivisible for the purposes of manufacture and incorporation into multiple commercially marketably products.

9. The wide band gap semiconductor wafer of claim 4 wherein the SiC substrate is processed through to a high voltage switch with the resulting wafer being capable of being used in high voltage transmission lines and electrical motors.

10. A method of growing and producing wide band gap semiconductor wafers in a microgravity environment, the method comprising the steps of:
a. providing a microgravity environment;
b. providing a substrate or an epi layer selected from the group consisting of Silicon Carbide (SiC), Galium Arsenide (GaAs), Indium Phosphide (InP), Cadmium Telluride (CdTe) and Galium Nitride (GaN) and placing the substrate or epi layer in a microgravity environment;
c. creating a saturated melt of the substrate or epi layer to be grown in an appropriate solvent;
d. controlling the melt temperature so it is brought down to below the liquidus line thus resulting in precipitation of a now supersaturated melt leaving the non-precipitated substrate or epi layer still dissolved in the melt; and
e. collecting the resulting substrate or epi layer claimed in one of claim 6.

11. A method of growing and producing wide band gap semiconductor wafers in a microgravity environment, the method comprising the steps of:
a. placing a wide band gap semiconductor wafer produced via traditional methods in a microgravity environment, the wafer comprising atoms arranged in a lattice;
b. heating the wafer to a point where the atoms in the lattice begin to experience motility;
c. allowing absence of gravity and other perturbing forces to settle the wafer into its lowest energy state and lowest defect density whereupon defects which could have been caused by external forces are eliminated;
d. allowing the wafer to cool down to a point where the atoms no longer have motility resulting in the wafer being in its natural, lowest energy state; and
e. collecting the resulting wafer claimed in one of claim 6.

\* \* \* \* \*